(12) United States Patent
Xu

(10) Patent No.: US 10,277,874 B2
(45) Date of Patent: *Apr. 30, 2019

(54) SYSTEMS, DEVICES, AND METHODS FOR LASER PROJECTORS

(71) Applicant: THALMIC LABS INC., Kitchener (CA)

(72) Inventor: Kai Xu, Mississauga (CA)

(73) Assignee: North Inc., Kitchener (CA)

( * ) Notice: Subject to any disclaimer, the term of this patent is extended or adjusted under 35 U.S.C. 154(b) by 0 days.

This patent is subject to a terminal disclaimer.

(21) Appl. No.: 15/661,415

(22) Filed: Jul. 27, 2017

(65) Prior Publication Data

US 2018/0035087 A1    Feb. 1, 2018

Related U.S. Application Data

(60) Provisional application No. 62/367,501, filed on Jul. 27, 2016.

(51) Int. Cl.
*G02B 27/01* (2006.01)
*H04N 9/31* (2006.01)
(Continued)

(52) U.S. Cl.
CPC ....... *H04N 9/3155* (2013.01); *G02B 27/0172* (2013.01); *H01S 5/0014* (2013.01);
(Continued)

(58) Field of Classification Search
CPC combination set(s) only.
See application file for complete search history.

(56) References Cited

U.S. PATENT DOCUMENTS 3,408,133 A    10/1968  Lee
3,712,716 A     1/1973  Cornsweet et al.
(Continued)

FOREIGN PATENT DOCUMENTS

JP    61-198892 A     9/1986
JP    10-319240 A    12/1998
(Continued)

OTHER PUBLICATIONS

Amitai, "P-27: A Two-dimensional Aperture Expander for Ultra-Compact, High-Performance Head-Worn Displays," *SID Symposium Digest of Technical Papers*, vol. 36, No. 1 (2005), pp. 360-363.
(Continued)

*Primary Examiner* — Van N Chow
(74) *Attorney, Agent, or Firm* — Cozen O'Connor

(57) ABSTRACT

Laser safety systems, devices, and methods for use in laser projectors are described. A laser projector includes any number of laser diodes that each emit laser light, a shared laser diode power source, a photodetector to detect a power/intensity of the laser light, a beam splitter to direct a first portion of the light towards the photodetector and a second portion of the light towards an output on the projector, and a laser safety circuit responsive to signals from the photodetector. The laser safety circuit selectively electrically couples/uncouples the laser diodes from the power source depending on the power/intensity of the laser light detected by the photodetector. Particular applications of the laser safety systems, devices, and methods in a wearable heads-up display are described.

10 Claims, 6 Drawing Sheets

(51) Int. Cl.
*H01S 5/00* (2006.01)
*H01S 5/068* (2006.01)
*H01S 5/042* (2006.01)
*H01S 5/40* (2006.01)

(52) U.S. Cl.
CPC ....... *H01S 5/06825* (2013.01); *H04N 9/3161* (2013.01); *H04N 9/3194* (2013.01); *G02B 2027/0112* (2013.01); *G02B 2027/0178* (2013.01); *H01S 5/042* (2013.01); *H01S 5/4093* (2013.01)

(56) References Cited

U.S. PATENT DOCUMENTS

| | | | |
|---|---|---|---|
| 4,978,213 A | 12/1990 | El Hage | |
| 5,103,323 A | 4/1992 | Magarinos et al. | |
| 5,231,674 A | 7/1993 | Cleveland et al. | |
| 5,467,104 A | 11/1995 | Furness, III et al. | |
| 5,589,956 A | 12/1996 | Morishima et al. | |
| 5,596,339 A | 1/1997 | Furness, III et al. | |
| 5,742,421 A | 4/1998 | Wells et al. | |
| 6,008,781 A | 12/1999 | Furness, III et al. | |
| 6,027,216 A | 2/2000 | Guyton et al. | |
| 6,184,847 B1 | 2/2001 | Fateh et al. | |
| 6,204,829 B1 | 3/2001 | Tidwell | |
| 6,236,476 B1 | 5/2001 | Son et al. | |
| 6,317,103 B1 | 11/2001 | Furness, III et al. | |
| 6,353,503 B1 | 3/2002 | Spitzer et al. | |
| 6,377,277 B1 | 4/2002 | Yamamoto | |
| 6,639,570 B2 | 10/2003 | Furness, III et al. | |
| 6,972,734 B1 | 12/2005 | Ohshima et al. | |
| 7,473,888 B2 | 1/2009 | Wine et al. | |
| 7,640,007 B2 | 12/2009 | Chen et al. | |
| 7,684,105 B2 | 3/2010 | Lamontagne et al. | |
| 7,747,113 B2 | 6/2010 | Mukawa et al. | |
| 7,773,111 B2 | 8/2010 | Cleveland et al. | |
| 7,850,306 B2 | 12/2010 | Uusitalo et al. | |
| 7,925,100 B2 | 4/2011 | Howell et al. | |
| 7,927,522 B2 | 4/2011 | Hsu | |
| 8,120,828 B2 | 2/2012 | Schwerdtner | |
| 8,179,604 B1 | 5/2012 | Prada Gomez et al. | |
| 8,188,937 B1 | 5/2012 | Amafuji et al. | |
| 8,355,671 B2 | 1/2013 | Kramer et al. | |
| 8,560,976 B1 | 10/2013 | Kim | |
| 8,634,119 B2 | 1/2014 | Bablumyan et al. | |
| 8,666,212 B1 | 3/2014 | Amirparviz | |
| 8,704,882 B2 | 4/2014 | Turner | |
| 8,922,481 B1 | 12/2014 | Kauffmann et al. | |
| 8,922,898 B2 | 12/2014 | Legerton et al. | |
| 8,970,571 B1 | 3/2015 | Wong et al. | |
| 8,971,023 B2 | 3/2015 | Olsson et al. | |
| 9,086,687 B2 | 7/2015 | Park et al. | |
| 9,135,708 B2 | 9/2015 | Ebisawa | |
| 9,477,079 B2 | 10/2016 | Bailey et al. | |
| 9,766,449 B2 | 9/2017 | Bailey et al. | |
| 9,798,149 B1* | 10/2017 | Saracco | G02B 27/108 |
| 2001/0033402 A1 | 10/2001 | Popovich | |
| 2002/0003627 A1 | 1/2002 | Rieder | |
| 2002/0007118 A1 | 1/2002 | Adachi et al. | |
| 2002/0030636 A1 | 3/2002 | Richards | |
| 2002/0093701 A1 | 7/2002 | Zhang et al. | |
| 2002/0120916 A1 | 8/2002 | Snider, Jr. | |
| 2004/0174287 A1 | 9/2004 | Deak | |
| 2005/0012715 A1 | 1/2005 | Ford | |
| 2006/0238707 A1 | 10/2006 | Elvesjo et al. | |
| 2007/0078308 A1 | 4/2007 | Daly | |
| 2007/0132785 A1 | 6/2007 | Ebersole, Jr. et al. | |
| 2009/0109241 A1 | 4/2009 | Tsujimoto | |
| 2009/0179824 A1 | 7/2009 | Tsujimoto et al. | |
| 2009/0207464 A1 | 8/2009 | Wiltshire et al. | |
| 2009/0258669 A1 | 10/2009 | Nie et al. | |
| 2009/0322653 A1 | 12/2009 | Putilin et al. | |
| 2010/0053555 A1 | 3/2010 | Enriquez et al. | |
| 2010/0060551 A1 | 3/2010 | Sugiyama et al. | |
| 2010/0142015 A1 | 6/2010 | Kuwahara et al. | |
| 2010/0149073 A1 | 6/2010 | Chaum et al. | |
| 2010/0150415 A1 | 6/2010 | Atkinson et al. | |
| 2010/0239776 A1 | 9/2010 | Yajima et al. | |
| 2012/0002256 A1 | 1/2012 | Lacoste et al. | |
| 2012/0139817 A1 | 6/2012 | Freeman | |
| 2012/0169752 A1 | 7/2012 | Kurozuka | |
| 2012/0182309 A1 | 7/2012 | Griffin et al. | |
| 2012/0188158 A1 | 7/2012 | Tan et al. | |
| 2012/0249797 A1 | 10/2012 | Haddick et al. | |
| 2012/0290401 A1 | 11/2012 | Neven | |
| 2012/0302289 A1 | 11/2012 | Kang | |
| 2013/0009853 A1 | 1/2013 | Hesselink et al. | |
| 2013/0016292 A1 | 1/2013 | Miao et al. | |
| 2013/0016413 A1 | 1/2013 | Saeedi et al. | |
| 2013/0088413 A1 | 4/2013 | Raffle et al. | |
| 2013/0135722 A1 | 5/2013 | Yokoyama | |
| 2013/0165813 A1 | 6/2013 | Chang et al. | |
| 2013/0169560 A1 | 7/2013 | Cederlund et al. | |
| 2013/0198694 A1 | 8/2013 | Rahman et al. | |
| 2013/0215235 A1 | 8/2013 | Russell | |
| 2013/0222384 A1 | 8/2013 | Futterer | |
| 2013/0265437 A1 | 10/2013 | Thörn et al. | |
| 2013/0285901 A1 | 10/2013 | Lee et al. | |
| 2013/0300652 A1 | 11/2013 | Raffle et al. | |
| 2013/0332196 A1 | 12/2013 | Pinsker | |
| 2013/0335302 A1 | 12/2013 | Crane et al. | |
| 2014/0045547 A1 | 2/2014 | Singamsetty et al. | |
| 2014/0125760 A1 | 5/2014 | Au et al. | |
| 2014/0198034 A1 | 7/2014 | Bailey et al. | |
| 2014/0198035 A1 | 7/2014 | Bailey et al. | |
| 2014/0202643 A1 | 7/2014 | Hikmet et al. | |
| 2014/0204455 A1 | 7/2014 | Popovich et al. | |
| 2014/0204465 A1 | 7/2014 | Yamaguchi | |
| 2014/0226193 A1 | 8/2014 | Sun | |
| 2014/0232651 A1 | 8/2014 | Kress et al. | |
| 2014/0285429 A1 | 9/2014 | Simmons | |
| 2014/0368896 A1 | 12/2014 | Nakazono et al. | |
| 2015/0036221 A1 | 2/2015 | Stephenson | |
| 2015/0156716 A1 | 6/2015 | Raffle et al. | |
| 2015/0205126 A1 | 7/2015 | Schowengerdt | |
| 2015/0205134 A1 | 7/2015 | Bailey et al. | |
| 2015/0268821 A1 | 9/2015 | Ramsby et al. | |
| 2015/0325202 A1 | 11/2015 | Lake et al. | |
| 2015/0362734 A1 | 12/2015 | Moser et al. | |
| 2015/0378162 A1 | 12/2015 | Bailey et al. | |
| 2016/0033771 A1 | 2/2016 | Tremblay et al. | |
| 2016/0202081 A1 | 7/2016 | Debieuvre et al. | |
| 2016/0238845 A1 | 8/2016 | Alexander et al. | |
| 2016/0274365 A1 | 9/2016 | Bailey et al. | |
| 2016/0274758 A1 | 9/2016 | Bailey | |
| 2016/0327796 A1 | 11/2016 | Bailey et al. | |
| 2016/0327797 A1 | 11/2016 | Bailey et al. | |
| 2016/0349514 A1 | 12/2016 | Alexander et al. | |
| 2016/0349515 A1 | 12/2016 | Alexander et al. | |
| 2016/0349516 A1 | 12/2016 | Alexander et al. | |
| 2016/0377865 A1 | 12/2016 | Alexander et al. | |
| 2016/0377866 A1 | 12/2016 | Alexander et al. | |
| 2017/0068095 A1 | 3/2017 | Holland et al. | |
| 2017/0097753 A1 | 4/2017 | Bailey et al. | |
| 2017/0115483 A1 | 4/2017 | Aleem et al. | |
| 2017/0153701 A1 | 6/2017 | Mahon et al. | |
| 2017/0205876 A1 | 7/2017 | Vidal et al. | |
| 2017/0212290 A1 | 7/2017 | Alexander et al. | |
| 2017/0212349 A1 | 7/2017 | Bailey et al. | |
| 2017/0219829 A1 | 8/2017 | Bailey | |
| 2017/0299956 A1 | 10/2017 | Holland et al. | |
| 2017/0343796 A1 | 11/2017 | Bailey et al. | |
| 2017/0343797 A1 | 11/2017 | Bailey et al. | |
| 2018/0007255 A1 | 1/2018 | Tang | |

FOREIGN PATENT DOCUMENTS

| | | |
|---|---|---|
| JP | 2013-127489 A | 6/2013 |
| JP | 2013-160905 A | 8/2013 |
| KR | 10-2004-0006609 A | 1/2004 |

(56) References Cited

FOREIGN PATENT DOCUMENTS

| WO | 2014/155288 A2 | 10/2014 |
|---|---|---|
| WO | 2015/123775 A1 | 8/2015 |

OTHER PUBLICATIONS

Ayras et al., "Exit pupil expander with a large field of view based on diffractive optics," *Journal of the SID*, vol. 17, No. 8 (2009), pp. 659-664.

Chellappan et al., "Laser-based display: a review," *Applied Optics*, vol. 49, No. 25 (2010), pp. 79-98.

Cui et al., " Diffraction from angular multiplexing slanted volume hologram gratings," *Optik*, vol. 116 (2005), pp. 118-122.

Curatu et al., "Dual Purpose Lens for an Eye-tracked Projection Head-Mounted Display," *International Optical Design Conference 2006*, SPIE-OSA, vol. 6342 (2007), pp. 63420X-1-63420X-7.

Curatu et al., "Projection-based head-mounted display with eye-tracking capabilities," *Proc. of SPIE*, vol. 5875 (2005), pp. 58750J-1-58750J-9.

Essex, "Tutorial on Optomechanical Beam Steering Mechanisms," College of Optical Sciences, University of Arizona, 2006, 8 pages.

Fernandez et al., "Optimization of a thick polyvinyl alcohol-acrylamide photopolymer for data storage using a combination of angular and peristrophic holographic multiplexing," *Applied Optics*, vol. 45, No. 29 (2006), pp. 7661-7666.

Hainich et al., "Chapter 10: Near-Eye Displays," in: *Displays—Fundamentals & Applications*, 2011, pp. 439-503.

Hornstein et al., "Maradin's Micro-Minor—System Level Synchronization Notes," *SID 2012 Digest* (2012), pp. 981-984.

International Search Report and Written Opinion, dated Apr. 25, 2017, for International Application No. PCT/US2016/067246, 10 pages.

International Search Report and Written Opinion, dated Dec. 8, 2016, for International Application No. PCT/US2016/050225, 15 pages.

International Search Report and Written Opinion, dated Jan. 18, 2017, for International Application No. PCT/US2016/054852, 12 pages.

International Search Report and Written Opinion, dated Jun. 8, 2016, for International Application No. PCT/US2016/018293, 17 pages.

International Search Report and Written Opinion, dated Jun. 8, 2016, for International Application No. PCT/US2016/018298, 14 pages.

International Search Report and Written Opinion, dated Jun. 8, 2016, for International Application No. PCT/US2016/018299, 12 pages.

International Search Report and Written Opinion, dated Oct. 13, 2017, for International Application No. PCT/US2017/040323, 16 pages.

International Search Report and Written Opinion, dated Sep. 28, 2017, for International Application No. PCT/US2017/027479, 13 pages.

Itoh et al., "Interaction-free calibration for optical see-through head-mounted displays based on 3D eye localization," *2014 IEEE Symposium on 3D User Interfaces* (3DUI), (2014), pp. 75-82.

Janssen, "Radio Frequency (RF)" 2013, retrieved from https://web.archive.org/web/20130726153946/https://www.techopedia.com/definition/5083/radio-frequency-rf, retrieved on Jul. 12, 2017, 2 pages.

Kessler, "Optics of Near to Eye Displays (NEDs)," *Oasis 2013*, Tel Aviv, Israel, Feb. 19, 2013, 37 pages.

Kress et al., "A review of head-mounted displays (HMD) technologies and applications for consumer electronics," *Proc. of SPIE*, vol. 8720 (2013), pp. 87200A-1-87200A-13.

Kress et al., "Diffractive and Holographic Optics as Optical Combiners in Head Mounted Displays," *Proceedings of the 2013 ACM Conference on Pervasive and Ubiquitous Computing Adjunct Publication*, Zurich, Switzerland, Sep. 8-12, 2013, pp. 1479-1482.

Kress, "Optical architectures for see-through wearable displays," *Bay Area—SID Seminar*, Bay Area, Apr. 30, 2014, 156 pages.

Levola, "7.1: Invited Paper: Novel Diffractive Optical Components for Near to Eye Displays," *SID Symposium Digest of Technical Papers*, vol. 37, No. 1 (2006), pp. 64-67.

Liao et al., "The Evolution of MEMS Displays," *IEEE Transcations on Industrial Electronics*, vol. 56, No. 4 (2009), pp. 1057-1065.

Lippert, "Chapter 6: Display Devices: RSD (Retinal Scanning Display)," in: *The Avionics Handbook*, 2001, 8 pages.

Majaranta et al., "Chapter 3: Eye-Tracking and Eye-Based Human-Computer Interaction," in *Advances in Physiological Computing*, 2014, pp. 39-65.

Merriam-Webster, "Radio Frequencies" retrieved from https://www.merriam-webster.com/table/collegiate/radiofre.htm, retrieved on Jul. 12, 2017, 2 pages.

Schowengerdt et al., "Stereoscopic retinal scanning laser display with integrated focus cues for ocular accommodation," *Proc. of SPIE-IS&T Electronic Imaging*, vol. 5291 (2004), pp. 366-376.

Silverman et al., "58.5L: Late-News Paper: Engineering a Retinal Scanning Laser Display with Integrated Accommodative Depth Cues," *SID 03 Digest*, (2003), pp. 1538-1541.

Takatsuka et al., "Retinal projection display using diffractive optical element," *Tenth International Conference on Intelligent Information Hiding and Multimedia Signal Processing*, IEEE, (2014), pp. 403-406.

Urey et al., " Optical performance requirements for MEMS-scanner based microdisplays," *Conf. on MOEMS and Miniaturized Systems*, SPIE, vol. 4178 (2000), pp. 176-185.

Urey, "Diffractive exit-pupil expander for display applications," *Applied Optics*, vol. 40, No. 32 (2001), pp. 5840-5851.

Viirre et al., "The Virtual Retina Display: A New Technology for Virtual Reality and Augmented Vision in Medicine," *Proc. of Medicine Meets Virtual Reality* (1998), pp. 252-257.

\* cited by examiner

SYSTEMS, DEVICES, AND METHODS FOR LASER PROJECTORS

TECHNICAL FIELD

The present systems, devices, and methods generally relate to laser projectors and particularly relate to the safety of laser projectors.

BACKGROUND

Description of the Related Art

Laser Projectors

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, the at least one controllable mirror may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

Laser Safety

Malfunction or improper use of laser devices can result in temporary or permanent damage to the eye; therefore, laser safety precautions are essential. Safety measurements for lasers and laser devices include: the maximum permissible exposure (MPE) (i.e., the maximum amount of user exposure before damage occurs), and the accessible emission limit (AEL) (i.e., the emitted power of the laser that is accessible in use). MPE is measured as power density ($W/cm^2$ or $J/cm^2$) and AEL is measured as power (W or J) or power density ($W/cm^2$ or $J/cm^2$) depending on the specific laser wavelength.

Wearable Heads-Up Displays

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. Examples of wearable heads-up displays include: the Google Glass®, the Optinvent Ora®, the Epson Moverio®, and the Sony Glasstron®, just to name a few.

The optical performance of a wearable heads-up display is an important factor in its design. When it comes to face-worn devices, however, users also care a lot about aesthetics. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal. Most wearable heads-up displays presented to date employ large display components and, as a result, most wearable heads-up displays presented to date are considerably bulkier and less stylish than conventional eyeglass frames.

A challenge in the design of wearable heads-up displays is to minimize the bulk of the face-worn apparatus while still providing displayed content with sufficient visual quality. There is a need in the art for wearable heads-up displays of more aesthetically-appealing design that are capable of safely providing high-quality images to the user without introducing unreasonable risk to the user's eye(s).

BRIEF SUMMARY

A laser projector may be summarized as including: at least one laser diode; a power source; a photodetector responsive to laser light output by the at least one laser diode; a beam splitter positioned and oriented to direct a first portion of laser light from the at least one laser diode along a first optical path towards the photodetector and a second portion of laser light from the at least one laser diode along a second optical path towards an output of the laser projector; and a laser safety circuit communicatively coupled to the photodetector and responsive to signals therefrom, the laser safety circuit comprising a switch that mediates an electrical coupling between the power source and the at least one laser diode, wherein in response to a signal from the photodetector indicative that a power of the laser light output by the at least one laser diode exceeds a threshold, the switch interrupts a supply of power to the at least one laser diode from the power source. The laser safety circuit may include: a latch that is communicatively coupled to the photodetector and to the switch, wherein: a state of the latch is responsive to signals from the photodetector and the switch is responsive to the state of the latch; the state of the latch changes from a first state to a second state in response to the signal from the photodetector indicative that the power of the laser light output by the at least one laser diode exceeds the threshold; and the switch interrupts the supply of power to the at least one laser diode from the power source in response to the state of the latch changing from the first state to the second state. The latch may be operable to store a current state selected from the first state and the second state and maintain the current state during a reboot event.

The laser projector may include a processor communicatively coupled to the at least one laser diode and to the photodetector, the processor to modulate the at least one laser diode, wherein in response to the signal from the photodetector indicative that the power of the laser light output by the at least one laser diode exceeds the threshold the processor stops modulating the at least one laser diode and prevents further modulations of the at least one laser diode. The laser projector may further include a non-transitory processor-readable storage medium communicatively coupled to the processor, wherein: in response to the signal from the photodetector indicative that the power of the laser light output by the at least one laser diode exceeds the threshold, the processor stores a flag in the non-transitory processor-readable storage medium; and upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode.

The at least one laser diode of the laser projector may include: a red laser diode, a green laser diode, and a blue laser diode; and the photodetector may be responsive to laser light from each of the red laser diode, the green laser diode, and the blue laser diode, wherein the signal from the photodetector is indicative of a total combined power of red laser light from the red laser diode, green laser light from the green laser diode, and blue laser light from the blue laser diode. The at least one laser diode may further include an infrared laser diode; and the photodetector may further be responsive to infrared laser light from the infrared laser diode, wherein the signal from the photodetector is indicative of a total combined power of red laser light from the red laser diode, green laser light from the green laser diode, blue laser light from the blue laser diode, and infrared laser light from the infrared laser diode. The laser projector may further include a beam combiner oriented to receive red laser light from the red laser diode, green laser light from the green laser diode, blue laser light from the blue laser diode, and infrared laser light from the infrared laser diode and to combine the red laser light, the green laser light, the blue laser light, and the infrared laser light into an aggregate laser beam, at least a portion of the beam combiner positioned upstream from the beam splitter with respect to an optical path of the laser light.

The laser projector may further include: a support structure that in use is worn on a head of the user, wherein the laser projector is carried by the support structure; and a transparent combiner carried by the support structure and positioned within a field of view of the user, the transparent combiner to direct the second portion of laser light from the output of the laser projector to the field of view of the user.

The threshold of the laser projector may be an independent, non-varying threshold.

A method of operating a laser projector, may be summarized as including: providing power to at least one laser diode by a power source electrically coupled to the at least one laser diode; generating a laser light by the at least one laser diode; splitting the laser light into a first portion and a second portion by a beam splitter; directing the first portion of the laser light from the at least one laser diode along a first optical path towards a photodetector by the beam splitter; directing the second portion of the laser light from the at least one laser diode along a second optical path towards an output of the laser projector by the beam splitter; detecting the first portion of the laser light by the photodetector; outputting a signal by the photodetector in response to detecting the first portion of the laser light by the photodetector, the signal indicative of a power of the laser light generated by the at least one laser diode; receiving the signal from the photodetector by a laser safety circuit communicatively coupled to the photodetector, wherein the laser safety circuit includes a switch that mediates the electrical coupling between the power source and the at least one laser diode; and in response to the signal from the photodetector indicating that the power of the laser light generated by the at least one laser diode exceeds a threshold, interrupting, by the switch, a supply of power to the at least one laser diode from the power source. The method may further include: a laser safety circuit with a latch that is communicatively coupled to the photodetector and to the switch, a state of the latch responsive to the signal from the photodetector and the switch responsive to the state of the latch, and wherein in response to the signal from the photodetector indicating that the power of the laser light output by the at least one laser diode exceeds the threshold, changing, by the latch, the state of the latch from a first state to a second state; and wherein interrupting, by the switch, a supply of power to the at least one laser diode from the power source includes interrupting, by the switch, a supply of power to the at least one laser diode from the power source in response to the state of the latch changing from the first state to the second state. The method of operating a laser safety circuit with a latch may further include storing a current state of the latch; and maintaining the current state of the latch during a reboot event.

The laser projector may include a processor and generating a laser light by the at least one laser diode includes modulating the at least one laser diode by the processor; and the processor is communicatively coupled to the photodetector, the method further comprising: in response to the signal from the photodetector indicating that the power of the laser light generated by the at least one laser diode exceeds the threshold: stopping modulation of the at least one laser diode by the processor; and preventing further modulations of the at least one laser diode by the processor. The laser projector may include a non-transitory processor-readable storage medium communicatively coupled to the processor, and the method of operating the laser projector may further include: in response to the signal from the photodetector indicating that the power of the laser light generated by the at least one laser diode exceeds the threshold, storing, by the processor, a flag in the non-transitory processor-readable storage medium; and upon boot-up of the laser projector, checking for the flag stored in the non-transitory processor-readable storage medium by the processor and, in response to finding the flag stored in the non-transitory processor-readable storage medium by the processor, preventing modulations of the at least one laser diode by the processor.

The at least one laser diode may include a red laser diode, a green laser diode, and a blue laser diode; and generating a laser light by the at least one laser diode may further include generating a red laser light by the red laser diode, a green laser light by the green laser diode, and a blue laser light by the blue laser diode; detecting the first portion of the laser light by the photodetector may further include detecting, by the photodetector, respective first portions of each of the red laser light, the green laser light, and the blue laser light; and outputting a signal by the photodetector in response to detecting the first portion of the laser light by the photodetector may further include outputting by the photodetector, a signal indicative of a total combined power of the red laser light generated by red laser diode, the green laser light generated by the green laser diode, and the blue laser light generated by the blue laser diode. The at least one laser diode may further include an infrared laser diode; and generating a laser light by the at least one laser diode may further include generating an infrared laser light by the infrared laser diode; detecting, by the photodetector, respective first portions of each of the red laser light, the green laser light, and the blue laser light may further include detecting a first portion of the infrared laser light by the photodetector; and outputting by the photodetector, a signal indicative of a total combined power of the red laser light generated by red laser diode, the green laser light generated by the green laser diode, and the blue laser light generated by the blue laser diode may further include outputting by the photodetector, a signal indicative of a total combined power of the red laser light generated by red laser diode, the green laser light generated by the green laser diode, the blue laser light generated by the blue laser diode, and the infrared laser light generated by the infrared laser diode. The laser projector may further include a beam combiner, and the method of operating the laser projector may further include: combining the red laser light, the green laser light, the blue laser light, and the infrared laser light into an aggregate laser beam by the beam combiner before splitting the laser light into a first portion and a second portion by the beam splitter.

In response to the signal from the photodetector indicating that the laser light generated by the at least one laser diode exceeds the threshold, interrupting, by the switch, a supply of power to the at least one laser diode from the power source may further include: in response to the signal from the photodetector indicating that the laser light generated by the at least one laser diode exceeds an independent, non-varying threshold, interrupting, by the switch, a supply of power to the at least one laser diode from the power source.

A wearable heads-up display may be summarized as including: a support structure that in use is worn on the head of a user; a transparent combiner carried by the support structure and positioned in a field of view of at least one eye of the user when the support structure is worn on the head of the user; and a laser projector carried by the support structure and positioned and oriented to direct laser light towards the transparent combiner, the laser projector comprising: at least one laser diode; a power source; a photodetector responsive to laser light output by the at least one laser diode; a beam splitter positioned and oriented to direct a first portion of laser light from the at least one laser diode along a first optical path towards the photodetector and a second portion of laser light from the at least one laser diode along a second optical path towards an output of the laser projector; and a laser safety circuit communicatively coupled to the photodetector and responsive to signals therefrom, the laser safety circuit comprising a switch that mediates an electrical coupling between the power source and the at least one laser diode, wherein in response to a signal from the photodetector indicative that a power of the laser light output by the at least one laser diode exceeds a threshold, the switch interrupts a supply of power to the at least one laser diode from the power source. The laser safety circuit of the laser projector may further include a latch that is communicatively coupled to the photodetector and to the switch, wherein: a state of the latch is responsive to signals from the photodetector and the switch is responsive to the state of the latch; the state of the latch changes from a first state to a second state in response to the signal from the photodetector indicative that the power of the laser light output by the at least one laser diode exceeds the threshold; and the switch interrupts the supply of power to the at least one laser diode in response to the state of the latch changing from the first state to the second state. The latch may be operable to store a current state selected from the first state and the second state and maintain the current state during a reboot event.

The wearable heads-up display may further include a processor communicatively coupled to the at least one laser diode and to the photodetector, the processor to modulate the at least one laser diode, wherein in response to the signal from the photodetector indicative that the power of the laser light output by the at least one laser diode exceeds the threshold the processor stops modulating the at least one laser diode and prevents further modulations of the at least one laser diode. The wearable heads-up display many further include a non-transitory processor-readable storage medium communicatively coupled to the processor, wherein: in response to the signal from the photodetector indicative that the power of the laser light output by the at least one laser diode exceeds the threshold, the processor stores a flag in the non-transitory processor-readable storage medium; and upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode.

The at least one laser diode of the wearable heads-up display may include a red laser diode, a green laser diode, and a blue laser diode; and the photodetector may be responsive to laser light from each of the red laser diode, the green laser diode, and the blue laser diode, wherein the signal from the photodetector is indicative of a total combined power of red laser light from the red laser diode, green laser light from the green laser diode, and blue laser light from the blue laser diode. The at least one laser diode may further include an infrared laser diode; and the photodetector may further be responsive to infrared laser light from the infrared laser diode, wherein the signal from the photodetector is indicative of a total combined power of red laser light from the red laser diode, green laser light from the green laser diode, blue laser light from the blue laser diode, and infrared laser light from the infrared laser diode.

The threshold of the wearable heads-up display may be an independent, non-varying threshold.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with portable electronic devices and head-worn devices, have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

The headings and Abstract of the Disclosure provided herein are for convenience only and do not interpret the scope or meaning of the embodiments.

The various embodiments described herein provide systems, devices, and methods for safe operation of a laser projector and are particularly well-suited for use in near eye displays (e.g., wearable heads-up displays ("WHUDs")) that employ laser projectors.

Figure 1:
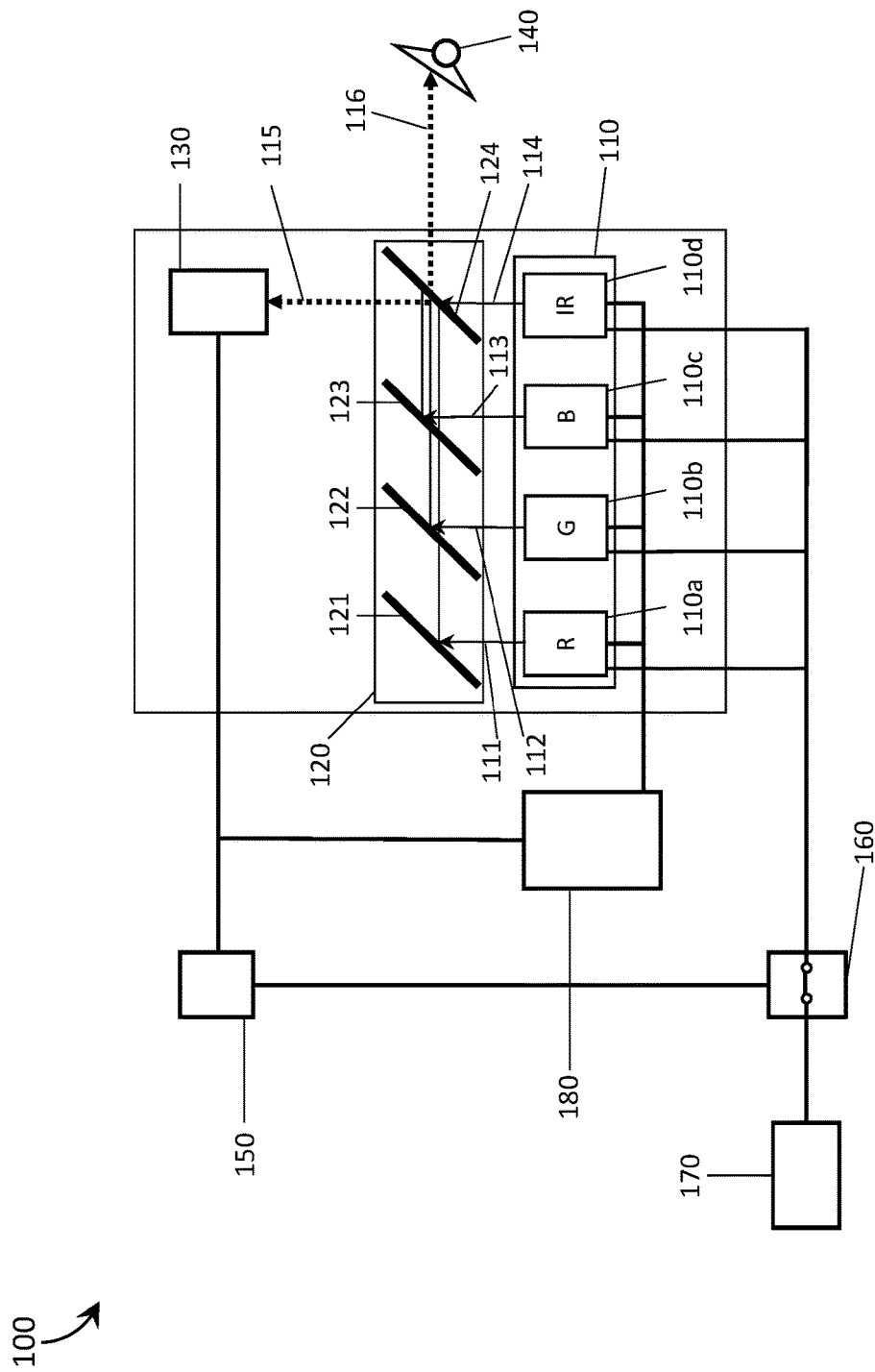
FIG. 1 is an illustrative diagram of a laser projector with a laser safety circuit in accordance with the present systems, devices, and methods.

FIG. 1 is an illustrative diagram of a laser projector 100 with a laser safety circuit (not separately called out to avoid clutter) in accordance with the present systems, devices, and methods. Laser projector 100 comprises, for example, four laser diodes 110a, 110b, 110c, 110d (collectively 110), a beam combiner 120, a photodetector 130 responsive to light emitted by each of laser diodes 110, at least one scan mirror 140, a laser diode power source 170 electrically coupled to laser diodes 110, and a processor 180 communicatively coupled to both laser diodes 110 and photodetector 130. The laser safety circuit component of laser projector 100 includes and/or is communicatively coupled to each of photodetector 130, power source 170, and laser diodes 110 and comprises, at least, a latch (e.g., "flip-flop") 150 communicatively coupled to photodetector 130 and a switch 160 that is communicatively coupled to latch 150 and electrically coupled in between power source 170 and laser diodes 110. The processor 180 (i.e., circuitry), can take the form of one or more of any of microprocessors, microcontrollers, application specific integrated circuits (ASICs), digital signal processors (DSPs), programmable gate arrays (PGAs), and/or programmable logic controllers (PLCs), or any other integrated or non-integrated circuit that perform logic operations).

Throughout this specification and the appended claims, the terms "electrical coupling" and "communicative coupling" (and variants, such as "electrically coupled" and "communicatively coupled") are often used. Generally, "electrical coupling" refers to any engineered arrangement for coupling electrical signals between one or more electrical signal carrier(s) (e.g., conductor(s) or semiconductor(s)) and includes without limitation galvanic coupling, inductive coupling, magnetic coupling, and/or capacitive coupling for the purpose of transferring, for example, electrical data signals, electrical information, and/or electrical power. Electrical coupling is a form of communicative coupling. "Communicative coupling" refers to any engineered arrangement for transferring signals (e.g., electrical or otherwise) for the purpose of transferring data, information, and/or power and includes, at least, electrical coupling (e.g., via electrically conductive wires, electrically conductive traces), magnetic coupling (e.g., via magnetic media), and/or optical coupling (e.g., via optical fiber).

In brief, the exemplary laser safety circuit of projector 100 operates as follows. Signals output by photodetector 130 control a state of latch 150 and the state of latch 150 controls a state of switch 160. Switch 160 is controllably switchable into and between a first state or configuration in which electrical coupling between power source 170 and laser diodes 110 is enabled by or through switch 160 and a second state or configuration in which electrical coupling between power source 170 and laser diodes 110 is disabled by or through switch 160. Laser diodes 110 consist of a first red laser diode (R), a second green laser diode (G), a third blue laser diode (B), and a fourth infrared laser diode (IR). All four laser diodes 110 are selectively electrically coupleable to power source 170 by or through at least one switch 160 and are communicatively coupled to the processor 180 that controls the operation (e.g., modulation) thereof. The first laser diode 110a emits a first (e.g., red) light signal 111, the second laser diode 110b emits a second (e.g., green) light signal 112, the third laser diode 110c emits a third (e.g., blue) light signal 113, and the fourth laser diode 110d emits a fourth (e.g., infrared) light signal 114. All four of light signals 111, 112, 113, and 114 enter or impinge on beam combiner 120 comprising optical elements 121, 122, 123, and 124. First light signal 111 is emitted towards first optical element 121 and reflected by first optical element 121 of beam combiner 120 towards second optical element 122 of beam combiner 120. Second light signal 112 is also directed towards second optical element 122. Second optical element 122 is formed of a dichroic material that is transmissive of the red wavelength of first light signal 111 and reflective of the green wavelength of second light signal 112; therefore, second optical element 122 transmits first light signal 111 and reflects second light signal 112. Second optical element 122 combines first light signal 111 and second light signal 112 into a single aggregate beam (shown as separate beams for illustrative purposes) and routes the aggregate beam towards third optical element 123 of beam combiner 120. Third light signal 113 is also routed towards third optical element 123. Third optical element 123 is formed of a dichroic material that is transmissive of the wavelengths of light (e.g., red and green) in the aggregate beam comprising first light signal 111 and second light signal 112 and reflective of the blue wavelength of third light signal 113. Accordingly, third optical element 123 transmits the aggregate beam comprising first light signal 111 and second light signal 112 and reflects third light signal 113. In this way, third optical element 123 adds third light signal 113 to the aggregate beam such that the aggregate beam comprises light signals 111, 112, and 113 (shown as separate beams for illustrative purposes) and routes the aggregate beam towards fourth optical element 124 in beam combiner 120. Fourth light signal 114 is also routed towards fourth optical element 124. Fourth optical element 124 is formed of a dichroic material that is partially transmissive of the visible wavelengths of light (e.g., red, green, and blue) in the aggregate beam comprising first light signal 111, second light signal 112, and third light signal 113 and partially reflective of the infrared wavelength of fourth light signal 114. Accordingly, fourth optical element 124 partially transmits the aggregate beam comprising first light signal 111, second light signal 112, and third light signal 113 and partially reflects fourth light signal 114. In this way, fourth optical element 124 adds at least a portion of fourth light signal 114 to the aggregate beam such that the aggregate beam comprises portions of light signals 111, 112, 113, and 114 and routes at least a portion of the aggregate beam towards scan mirror 140 and the output of projector 100.

In the exemplary implementation of projector 100, fourth optical element 124 is a dual-purpose optical component. In addition to functioning as the last optical combining element in optical combiner 120 (i.e., by combining fourth, infrared laser light 114 with the red, green, and blue laser light 111, 112, and 113, respectively), fourth optical element 124 also functions as a beam splitter in projector 100. To this end, fourth optical element 124 is positioned and oriented to direct a first portion 115 of the aggregate laser light (represented by a dashed arrow in FIG. 1) from laser diodes 110 (i.e., comprising first light 111, second light 112, third light 113, and fourth light 114) towards photodetector 130 and a second portion 116 of the aggregate laser light (also represented by a dashed arrow in FIG. 1) towards scan mirror 140 and an output of laser projector 100. In the implementation of FIG. 1, scan mirror 140 scans (e.g., raster scans) second portion 116 of the aggregate laser beam to output a projected display or illumination pattern. In the implementation of a wearable heads-up display, scan mirror 140 may direct the visible light to create display content in the field of view of a user, and may direct the infrared light to illuminate the eye of the user for the purpose of eye tracking. A person of skill in the art will appreciate that the visible and infrared light may take different paths before or beyond the scan mirror. A person of skill in the art will also appreciate that methods other than a scan mirror, such as beam steering and/or one or more digital light processor(s), can be employed to create display content or to direct the infrared light.

Photodetector 130 is responsive to first portion 115 of the aggregate laser beam and, in response to detecting first portion 115 of the aggregate laser beam, outputs a signal indicative of, based on, dependent on, or generally representative of the power or intensity of first portion 115 of the aggregate laser beam. In an implementation with multiple laser sources (e.g., multiple laser diodes 110), each laser source emitting light of a different wavelength or a different range of wavelengths (e.g., laser light signals 111, 112, 113, and 114), photodetector 130 is responsive to light within one or more waveband(s) that, in total (e.g., collectively in combination) includes all of the emitted wavelengths. Latch 150 is communicatively coupled to photodetector 130 and has a state that is responsive to signals therefrom. If and/or when a signal from photodetector 130 is below a threshold, latch 150 is in a first state; if and/or when a signal from photodetector 130 is above a threshold, latch 150 is in a second state. Latch 150 may be operable to store and maintain (i.e., keep or reload) its current state if a reboot event occurs. For example, if a signal indicative of laser light that exceeds the threshold caused latch 150 to be in the second state, the latch would still be in the second state following a reboot event unless the latch is positively cleared, via a separate action by the user that is not part of an automated or autonomous process of rebooting. Switch 160 is communicatively coupled to and responsive to the state of latch 150. A signal that indicates the state of latch 150 is received by switch 160 from latch 150. Switch 160 is selectively electrically coupleable between power source 170 and laser diodes 110. Switch 160 controllably/selectively enables or disables electrical coupling between power source 170 and laser diodes 110 in response to the state of latch 150. In other words, depending on the state of latch 150 (which itself depends on a magnitude of a signal output by photodetector 130, representative of a magnitude of the power or intensity of first portion 115 of the aggregate laser beam in projector 100), switch 160 selectively provides or blocks (e.g., interrupts) electrical power to laser diodes 110 from power source 170.

Throughout this specification and the appended claims, reference is often made to a "threshold" for the maximum safe power/intensity of laser light. This threshold may be defined based on a variety of factors including, for example, the wavelength(s) of the laser diode(s) (different wavelengths have different effects on the eye), the specific portion of light incident on the photodetector, the type of display employed, and/or the efficiency of any intervening optical elements in the optical path of the laser light between the laser diode(s) and the display/eye of the user (e.g., scan mirrors, lenses, polarizers, filters, diffractive optical elements). Once defined, the threshold may advantageously be non-varying and independent of any parameters that may change during the operation of the laser projector, such as the scan rate of a scan mirror (e.g., the scan mirror function may have a discrete safety mechanism). In some implementations, the threshold may take into account any number of failure modes and/or "worst-case scenarios" (such as a mirror failure that causes the laser spot to remain fixed in one place on the user's eye) so that any such failures or scenarios are accounted for in a single, static, non-varying threshold without having to introduce additional monitoring and feedback systems.

As an example, the laser safety circuit (e.g., upstream of the latch element of the laser safety circuit) may include a comparator operative to compare the signal coming from the photodetector to a static threshold value defined as outlined above.

The threshold may be calculated based on the maximum amount of light that can be safely received by an eye of a user and the percentage of attenuation of light through any intervening optical elements of the laser projector along the optical path between the laser diode(s) and the eye of the user. For example, the path of light from the laser diode(s) to the eye may be through the beam splitter, scanned over two scan mirrors, and redirected from a holographic optical element to the retina of the eye. In this example, if the maximum amount of light safely receivable by the eye is 1 mW, the holographic optical element has 30% loss of light, the two scan mirrors each lose 5% of the light, and the beam splitter directs 25% of the light to the photodetector, then the maximum power/intensity of light that can be received by the photodetector without exceeding 1 mW at the eye is 0.52 mW (i.e.

$$\left(\text{i.e., } 0.25 \times \frac{1}{(0.7 \times 0.95 \times 0.95 \times 0.75)} \text{ mW.}\right)$$

Thus in this example the threshold value may be set at 0.52 mW and the laser safety circuit may be configured to operate in the first configuration (in which the switch is closed and electrical power is coupled to the laser diodes) when the signal provided by the photodetector corresponds to less than 0.52 mW detected by the photodetector and in the second configuration (in which the switch is open and the laser diodes are cut-off from the power source) when the signal provided by the photodetector corresponds to greater than 0.52 mW detected by the photodetector. As a further protective measure, the threshold may be lowered to account for various failures modes, such as lowering the threshold by X % (e.g., 5%, 10%, 25%, 50% depending on the specific implementation) to ensure the laser light received by the eye will be safe even in the event of such a failure (e.g., in the event of a mirror disruption that causes the laser light to stop sweeping and instead project onto a single point at the user's eye).

Returning to FIG. 1, processor 180 is communicatively coupled to laser diodes 110 and controls (e.g., modulates) generation and emission of laser light 111, 112, 113, and 114 thereby. Processor 180 is also communicatively coupled to photodetector 130 (either directly or through elsewhere in the laser safety circuit). Through such communicative coupling processor 180 and receives a signal indicative or otherwise representative of the signal (including in some implementations the signal itself, or a copy of the signal) output by photodetector 130 when photodetector 130 detects first portion 115 of the aggregate laser beam. If the signal received by processor 180 is above a threshold value, processor 180 may control, modulate, or otherwise instruct laser diodes 110 to cease to emit any further laser light. This processor-based safety mechanism may be discrete from the latch/switch components of the laser safety circuit and, when implemented, provides insurance that lasers diodes 110 will not emit laser light even if they remain electrically coupled to power source 170 or if laser projector 100 is restarted or rebooted. To this latter end, processor 180 may be communicatively coupled to a non-transitory processor-readable storage medium or memory (not shown in FIG. 1) and when a signal above the threshold value is received from photodetector 130 by processor 180, processor 180 may trigger and store a flag in the memory that survives any rebooting function and is accessed by processor 180 upon any such rebooting in order to ensure that processor 180 continues to prevent any further emission of laser light by laser diodes 110. In this way, an "unsafe" system "remembers" its unsafe status and cannot be re-activated simply by rebooting or restarting the system.

Figure 2A:
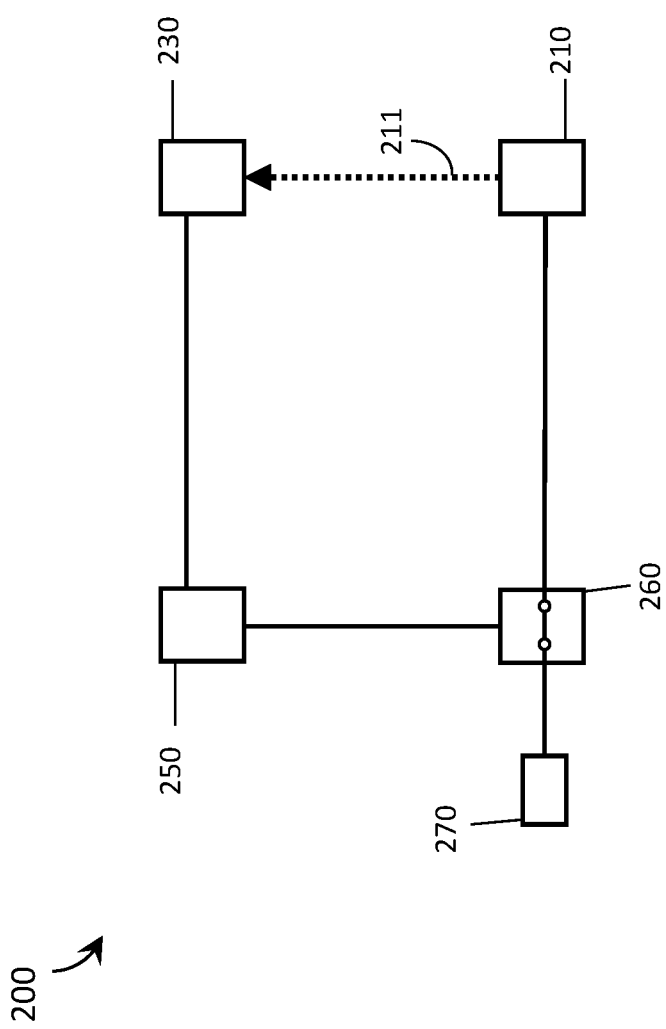
FIG. 2A is an illustrative block diagram of a laser safety circuit for a laser projector, the laser safety circuit shown in a first configuration in which laser light produced by the projector is below a power threshold and electrical coupling between the power source and the at least one laser diode is enabled in accordance with the present systems, devices, and methods.
Figure 2B:
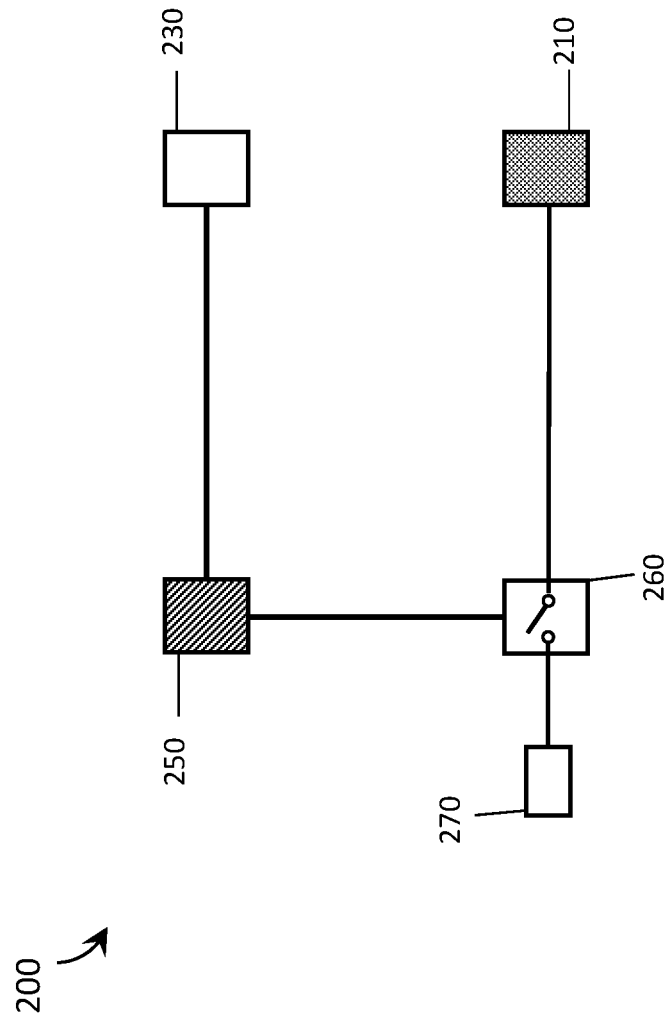
FIG. 2B is an illustrative block diagram of a laser safety circuit for a laser projector, shown in a second configuration in which the at least one laser diode of the projector is electrically uncoupled from the power source in accordance with the present systems, devices, and methods.

In FIG. 1, switch 160 is shown in an exemplary closed configuration indicating electrical coupling of laser diodes 110 and power source 170, thereby enabling the continued generation of first portion 115 and second portion 116 of aggregate laser light. In operation, an open switch indicates that first portion 115 of the aggregate beam has exceeded a safe power/intensity level, and that the signal output by photodetector has exceeded the threshold value. FIGS. 2A and 2B respectively provide illustrative examples of the "switch closed/safe laser output power detected" and "switch open/unsafe laser output power detected" configurations of the laser safety circuits described herein.

FIG. 2A is an illustrative block diagram of a laser safety circuit 200 for a laser projector, shown in a first configuration in which laser light 211 produced by at least one laser diode 210 of the projector is below a power or intensity threshold and electrical coupling between a power source 270 and the at least one laser diode 210 is enabled in accordance with the present systems, devices, and methods. Laser safety circuit 200 comprises the at least one laser diode 210, a photodetector 230 responsive to light emitted by the at least one laser diode 210, a latch or "flip-flop" 250 communicatively coupled to photodetector 230, a switch 260 communicatively coupled to latch 250, and a power source 270 electrically coupled to the at least one laser diode 210 through switch 260. The at least one laser diode 210 emits light signal 211 which is in part directed towards photodetector 230. Photodetector 230 is responsive to light signal 211 and outputs a signal representative of the power or intensity of light signal 211. Latch 250 is communicatively coupled to photodetector 230 and a state or configuration of latch 250 is responsive to the signal output by photodetector 230. Latch 250 is in a first state or configuration when the power or intensity of laser light 211 is below a maximum safe power level and the corresponding signal output by photodetector 230 is below a threshold value. Latch 250 is in a second state or configuration when the power or intensity of laser light 211 is above a maximum safe power level and the corresponding signal output by photodetector 230 is above the threshold value. In the illustrated example of FIG. 2, the power or intensity of laser light 211 is below the threshold so the signal provided by photodetector 230 to latch 250 causes latch 250 to enter or remain in the first state or configuration. Switch 260 is communicatively coupled to latch 250 and also selectively electrically coupleable between the at least one laser diode 210 and power source 270. Switch 260, and more specifically the selective electrical coupling between power source 270 and laser diode(s) 210 mediated by switch 260, is responsive to the state or configuration of latch 250. When latch 250 is in the first state or configuration, switch 260 is closed to enable electrical coupling between power source 270 and the at least one laser diode 210. When latch 250 is in the second state or configuration, switch 260 is open to disable electrical coupling between power source 270 and the at least one laser diode 210. Since FIG. 2 shows an example instance for which the power or intensity of light signal 211 is below the maximum safe power level and latch 250 is in the first state or configuration, switch 260 is closed in FIG. 2 and electrical coupling between power source 270 and the at least one laser diode 210 is enabled. The latch may be operable to store the current state and maintain (i.e., keep or reload) the state during and after a reboot event. In the circumstances and configuration of FIG. 2A, the latch would still be in the first state following the reboot event unless the latch is positively cleared, via a separate action by the user that is not part of an automated or autonomous process of rebooting. Electrical coupling of the power source and laser diodes would remain intact.

FIG. 2B is another illustrative block diagram of laser safety circuit 200 from FIG. 2A, this time shown in a second configuration in which the at least one laser diode 210 of the projector is electrical uncoupled from the power source 270 in accordance with the present systems, devices, and methods. In the illustrated example of FIG. 2B, photodetector 230 detects a laser light signal above the threshold, and photodetector 230 consequently outputs an above threshold signal. Latch 250 has received an above-threshold signal from photodetector 230 and entered into the second state or configuration (represented by shading of latch 250 in FIG. 2B). Switch 260 has responded to the second state or configuration of latch 250 and has opened to disable electrical coupling between the at least one laser diode 210 and power source 270. The at least one laser diode 210 is without power (represented by shading of at least one laser diode 210) and cannot emit a laser light signal. The latch may be operable to store the current state and maintain the state during and after a reboot event. In the circumstances and configuration of FIG. 2B, the latch would still be in the second state following a reboot event unless the latch is positively cleared, via a separate action by the user that is not part of an automated or autonomous process of rebooting. Electrical coupling of the power source and laser diodes would remain interrupted.

Figure 3:
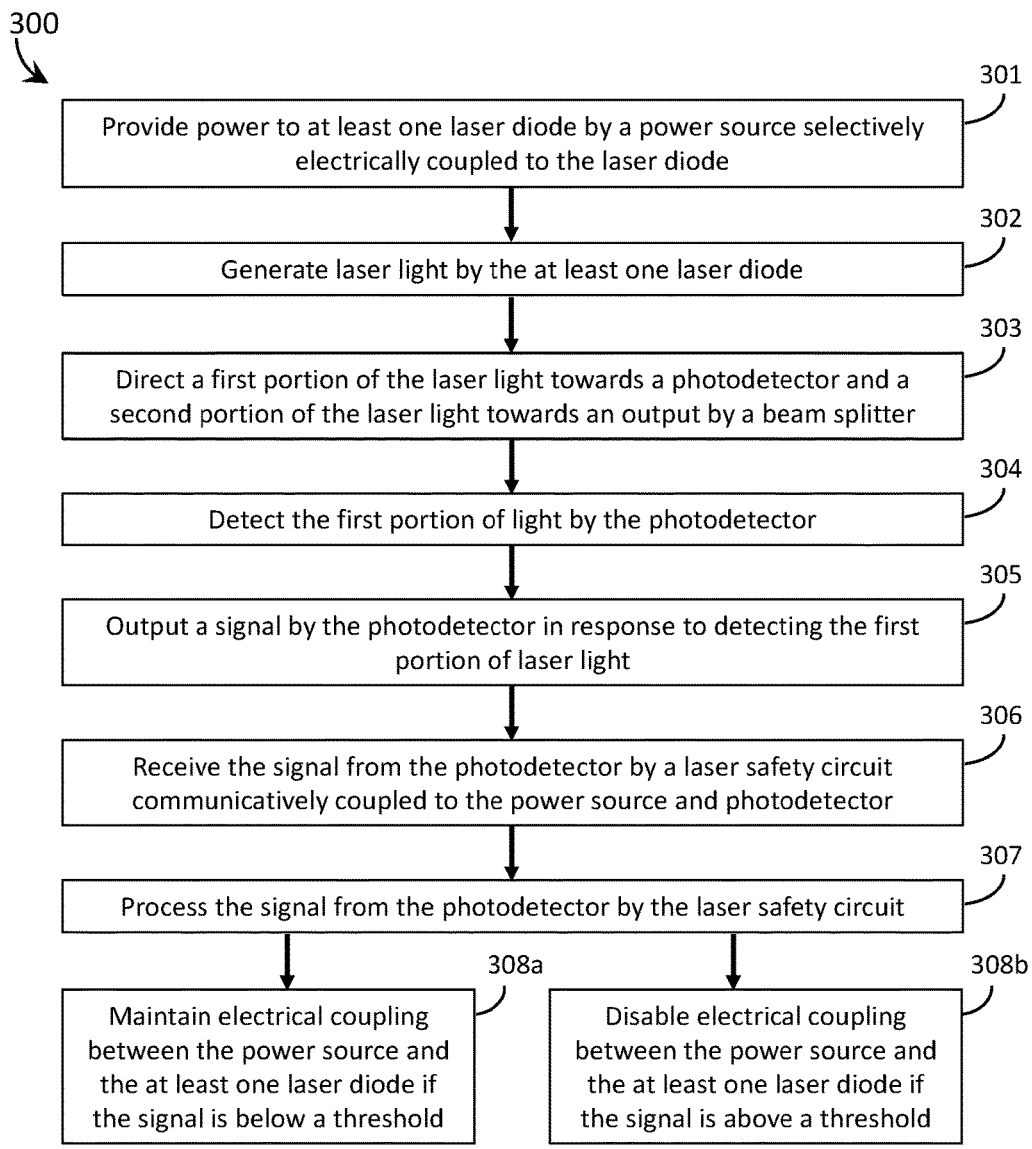
FIG. 3 is a flow diagram showing a method of operating a laser projector with a laser safety circuit in accordance with the present systems, devices, and methods.

FIG. 3 is a flow diagram showing a method 300 of operating a laser projector with laser safety circuit in accordance with the present systems, devices, and methods. The laser projector may be substantially similar, or even identical, to the laser projector 100 from FIG. 1 and the laser safety circuit may be substantially similar, or even identical, to that used in laser projector 100 and/or laser safety circuit 200 from FIGS. 2A and 2B. The laser projector generally includes a power source, at least one laser diode, a photodetector, and a laser safety circuit communicatively coupled between the photodetector and the power source. Method 300 comprises various acts 301, 302, 303, 304, 305, 306, 307, and 308*a/b*, though those of skill in the art will appreciate that in alternative embodiments certain acts may be omitted and/or additional acts may be added. Those of skill in the art will also appreciate that the illustrated order of the acts is shown for exemplary purposes only and may change in alternative embodiments.

At 301, the power source provides power to the at least one laser diode. The power source may be selectively electrically coupled through a switch to the at least one laser diode, the switch being part of the laser safety circuit and operative to allow or disable power to the at least one laser diode. At 301, the switch is "closed" to enable coupling of electrical power therethrough from the power source to the laser diode(s).

At 302, the at least one laser diode generates laser light using the electrical power received from the power source.

At 303, a beam splitter directs a first portion of the laser light towards a photodetector and a second portion of the laser light towards an output of the projector. Those of skill in the art will appreciate that the path of the laser light from the laser diode(s) to beam splitter may contain several optical elements (i.e., optics) that reflect, transmit, and/or combine the light. In some implementations the beam splitter may also act as a combiner of different laser light beams generated at 302 (as illustrated in the example of FIG. 1). The light output by the projector may be directed towards a scan mirror or other element(s) that directs the light to illuminate an area. The area may be a field of view of a user for display purposes or may be an eye of a user for eye tracking purposes.

At 304, the photodetector detects the first portion of light directed from the beam splitter at 303. The photodetector is responsive to all of the wavelengths of light included in the laser light generated by the at least one laser diode at 302. An example of a suitable photodetector having such wide optical spectral sensitivity is the ISL58344 Quad Segment Photo Sensor IC from Intersil.

At 305, the photodetector outputs a signal in response to detecting the first portion of light from the beam splitter at 304. The photodetector detects the power (e.g., wattage) and/or intensity of the laser light and outputs a voltage signal representative of the power and/or intensity. Generally, the voltage of the signal output by the photodetector is dependent on (e.g., proportional to) the power and/or intensity of the laser light detected by the photodetector at 304. The signal from the photodetector may be amplified by one or more amplifier(s) and/or converted from analog to digital by one or more analog-to-digital converter(s).

At 306, the laser safety circuit receives the signal from the photodetector. The laser safety circuit includes communicative coupling between the photodetector and the power source and may comprise a latch or "flip-flop" communicatively coupled to the photodetector with a state/configuration responsive to the signal from the photodetector, and a switch communicatively coupled to the latch and responsive to the state/configuration of the latch.

At 307, the laser safety circuit processes the signal from the photodetector. If, at 304, the photodetector detects a first portion of laser light that is below a maximum safe power level, then at 307 the laser safety circuit determines that the signal from the photodetector (output at 305) is below a threshold value. On the other hand, if, at 304, the photodetector detects a first portion of laser light that is at or above the maximum safe power level, then at 307 the laser safety circuit determines that the signal from the photodetector (output at 305) is above the threshold value.

From act 307, method 300 proceeds either to act 308*a* or act 308*b* depending on the magnitude of the signal provided, at 305, by the photodetector relative to the threshold. In response to the signal received from the photodetector by the laser safety circuit at 306 being below a threshold (e.g., in response to the laser safety circuit determining at 307 that the signal received from the photodetector is below the threshold), method 300 proceeds to act 308*a*; whereas in response to the signal received from the photodetector by the laser safety circuit at 306 being at or above the threshold (e.g., in response to the laser safety circuit determining at 307 that the signal received from the photodetector is above the threshold), method 300 proceeds to act 308*b*.

At 308*a*, the laser safety circuit maintains electrical coupling between the power source and the at least one laser diode in response to the signal received from the photodetector at 306 being below the threshold. In an implementation with a latch communicatively coupled to the photodetector and a switch communicatively coupled to the latch and selectively electrically coupled between the power source and the at least one laser diode, at 308*a* the switch remains closed, maintaining electrical coupling between the power source and the at least one laser diode.

Alternatively, at 308*b*, the laser safety circuit disables electrical coupling between the power source and the at least one laser diode in response to the signal received from the photodetector at 306 being at or above the threshold. In an implementation with a latch communicatively coupled to the photodetector and a switch communicatively coupled to the latch and selectively electrically coupled between the power source and the at least one laser diode, at 308*b* the switch opens to disable electrical coupling between the power source and the at least one laser diode and effectively switches off the at least one laser diode.

In an implementation with a latch, the method may comprise additional acts. These additional acts may include: storing a current state of the latch, and maintaining the state of the latch during and following a reboot event. Following 308*a*, the latch would be in a first state and electrical coupling between the power source and the at least one laser diode would be intact. Following 308*b*, the latch would be in a second state and electrical coupling between the power source and the at least one laser diode would be interrupted. The current state of the latch is maintained (i.e., kept or reloaded) during and following a reboot event until and unless the latch is positively cleared, via a separate action by the user that is not part of an automated or autonomous process of rebooting. If the latch were in a first state before a reboot event, the latch would remain in the first state following reboot of the laser projector, and the electrical coupling between the power source and the at least one laser diode would remain intact. Likewise, if the latch were in a second state before a reboot event, the latch would remain in the second state following reboot of the laser projector, and the electrical coupling between the power source and the at least one laser diode would remain interrupted.

Figure 4:
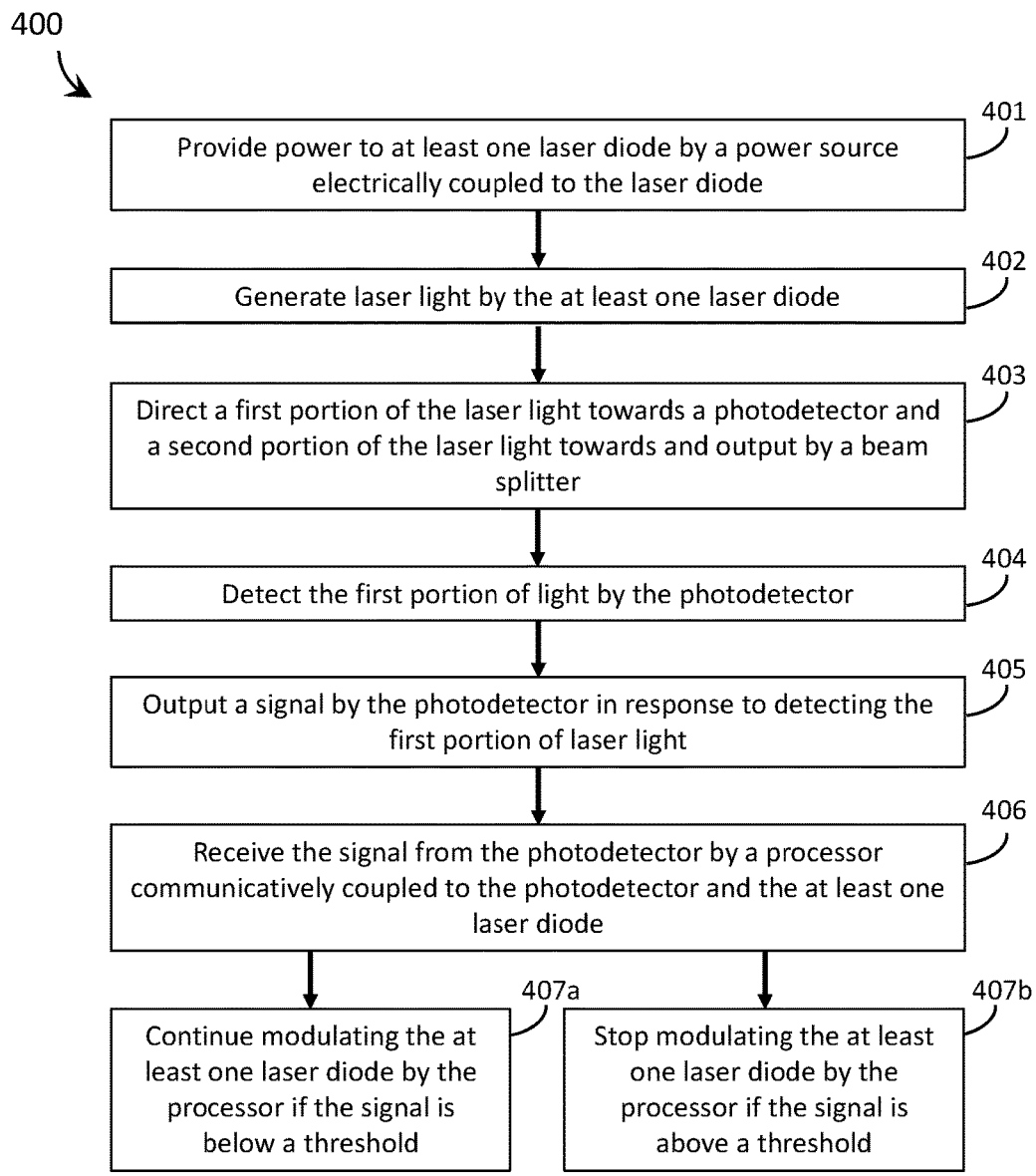
FIG. 4 is a flow diagram showing a method of operating a laser projector with a processor-based safety circuit including processor circuitry in accordance with the present systems, devices, and methods.

FIG. 4 is a flow diagram showing a method 400 of operating a laser projector with a processor-based safety circuit in accordance with the present systems, devices, and methods. The laser projector may be substantially similar, or even identical, to the laser projector 100 of FIG. 1, and generally includes a laser diode power source, at least one laser diode, a photodetector, and a processor communicatively coupled to both the photodetector and the at least one laser diode that modulates emission of light from the at least one laser diode. Method 400 comprises a variety of acts 401, 402, 403, 404, 405, 406, and 407a/b. Acts 401, 402, 403, 404, and 405 are substantially similar, or even identical, to acts 301, 302, 303, 304, and 305, respectively, of method 300. Those of skill in the art will appreciate that in alternative embodiments certain acts may be omitted and/or additional acts may be added. Those of skill in the art will also appreciate that the illustrated order of the acts is shown for exemplary purposes only and may change in alternative embodiments.

At 401, the power source provides power to the at least one laser diode. The power source may be selectively electrically coupled through a switch to the at least one laser diode, the switch being part of the laser safety circuit and operative to allow or disable power to the at least one laser diode. At 401, the switch is "closed" to enable coupling of electrical power therethrough from the power source to the laser diode(s).

At 402, the at least one laser diode generates laser light using the electrical power received from the power source. The emission of light from the laser diodes may be modulated by a processor.

At 403, a beam splitter directs a first portion of the laser light towards a photodetector and a second portion of the laser light towards an output of the projector. Those of skill in the art will appreciate that the path of the laser light from the laser diode(s) to beam splitter may contain several optical elements (i.e., optics) that reflect, transmit, and/or combine the light. In some implementations the beam splitter may also act as a combiner of different laser light beams generated at 402 (as illustrated in the example of FIG. 1). The light output by the projector may be directed towards a scan mirror or other element(s) that directs the light to illuminate an area. The area may be a field of view of a user for display purposes or may be an eye of a user for eye tracking purposes.

At 404, the photodetector detects the first portion of light directed from the beam splitter at 403. The photodetector is responsive to all of the wavelengths of light included in the laser light generated by the at least one laser diode at 402.

At 405, the photodetector outputs a signal in response to detecting the first portion of light from the beam splitter at 404. The photodetector detects the power (e.g., wattage) and/or intensity of the laser light and outputs a voltage signal representative of the power and/or intensity. Generally, the voltage of the signal output by the photodetector is dependent on (e.g., proportional to) the power and/or intensity of the laser light detected by the photodetector at 404. The signal from the photodetector may be amplified by one or more amplifier(s) and/or converted from analog to digital by one or more analog-to-digital converter(s) (ADCs).

At 406, the processor receives the signal from the photodetector. The processor is communicatively coupled to both the photodetector and the at least one laser diode and modulates the emission of light from the at least one laser diode.

From act 406, method 440 proceeds either to act 407a or act 407b depending on the magnitude of the signal provided by the photodetector at 405 relative to the threshold. In response to the signal received from the photodetector by the processor at 406 being below a threshold (e.g., in response to the processor determining that the signal received from the photodetector is below the threshold), method 400 proceeds to act 407a; whereas in response to the signal received from the photodetector by the processor at 406 being at or above the threshold (e.g., in response to the processor determining that the signal received from the photodetector is above the threshold), method 400 proceeds to act 407b.

At 407a, the processor continues modulating emission of light from the at least one laser diode in response to the signal received from the photodetector at 406 being below the threshold (e.g., in response to the processor determining that the signal is below the threshold).

At 407b, the processor stops modulating emission of light from the at least one laser diode in response to the signal received from the photodetector at 406 being at or above the threshold (e.g., in response to the processor determining that the signal is over the threshold). This means that even if there is still electrical power coupled to the laser diode(s), the processor that controls the laser diode(s) causes the laser diode(s) not to emit any laser light. Advantageously, the processor may be communicatively coupled to a non-transitory processor-readable storage medium or memory and, in response to the signal received from the photodetector at 406 being at or above the threshold (e.g., in response to the processor determining that the signal is at or over the threshold), the processor may trigger and store a flag in the memory that survives any rebooting function or loss of power to the safety circuit or device and is accessed by the processor upon any such rebooting or restoration of power in order to ensure that the processor continues to prevent any further emission of laser light by laser diodes.

While methods 300 and 400 are illustrated and described separately, methods 300 and 400 may be performed in combination by a single laser projector. For example, laser projector 100 of FIG. 1 includes both a laser safety circuit (e.g., latch 150, switch 160, and so on) and a processor 180, where the laser safety circuit component may perform the associated acts of method 300 and, concurrently, the processor component may perform the associated acts of method 400. In this way, a layer of redundancy is incorporated to enhance the overall effectiveness and reliability in the safety of the laser projector.

As previously described, the laser projector safety systems, devices, and methods described herein are particularly well-suited for use in WHUDs. An illustrative example of a WHUD that employs a laser projector with a laser safety circuit is provided in FIG. 5.

Figure 5:
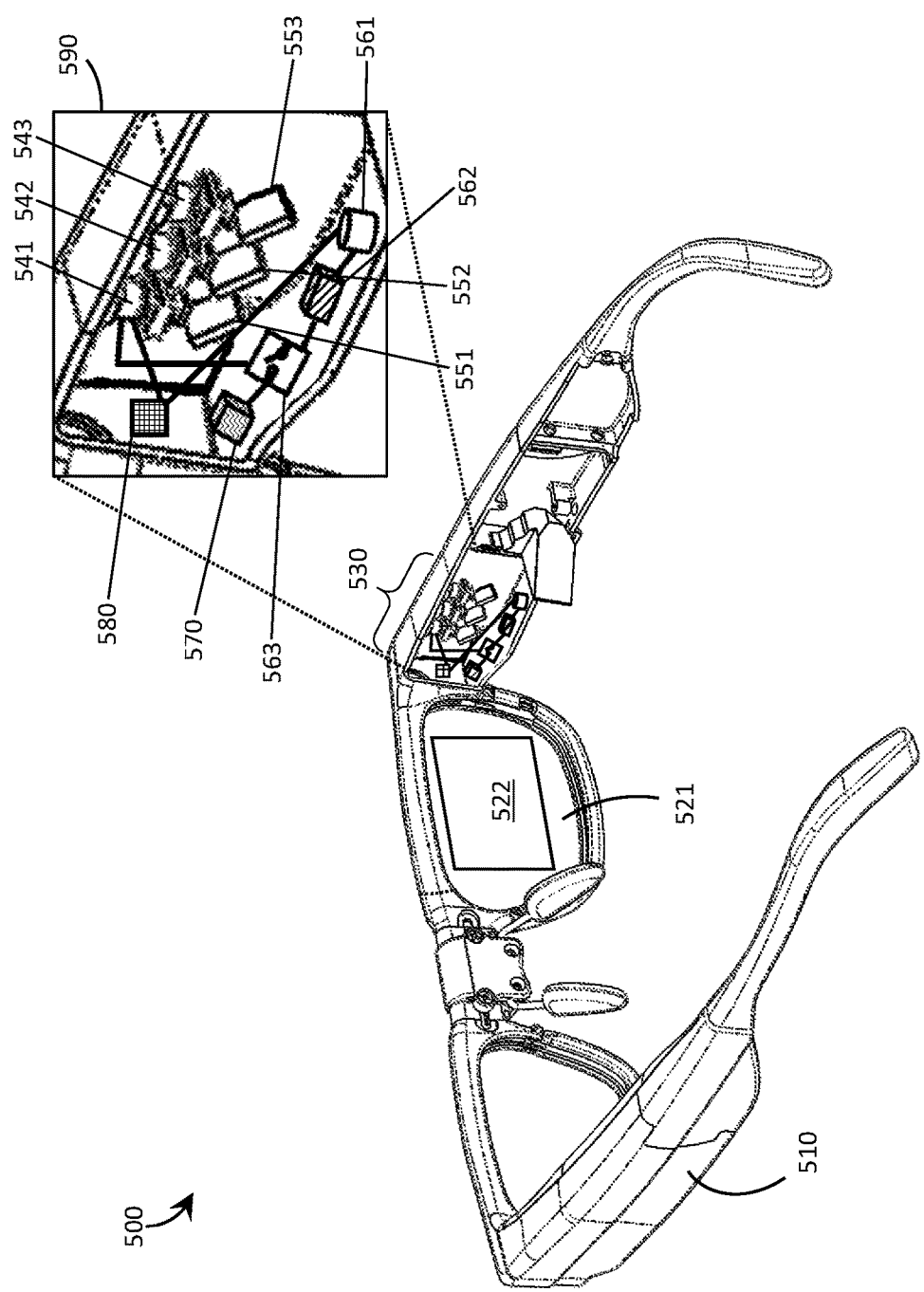
FIG. 5 is partial cutaway perspective view of a wearable heads-up display with a laser projector and associated laser safety circuit in accordance with the present systems, devices, and methods.

FIG. 5 is partial cutaway perspective view of a WHUD 500 with a laser projector 530 and associated laser safety circuit (not separately called out) in accordance with the present systems, devices, and methods. WHUD 500 includes a support structure 510 that in use is worn on the head of a user and has a general shape and appearance of an eyeglasses frame. Support structure 510 carries multiple components, including: a lens 521, a transparent combiner 522, and laser projector 530. Laser projector 530 (see magnified view thereof in box 590) is generally similar, or even identical, to laser projector 100 from FIG. 1 and includes laser diodes 541, 542, and 543, optical elements 551 and 552, a beam combiner/splitter 553, a laser diode power source 570 selectively electrically coupleable to laser diodes 541, 542, and 543, circuitry in the form of a processor 580 communicatively coupled to and operative to modulate emission of light from laser diodes 541, 542, and 543, and a laser safety circuit comprising: a photodetector 561 communicatively coupled to processor 580, a latch 562 communicatively coupled to photodetector 561, and a switch 563 selectively electrically coupled between power source 570 and laser diodes 541, 542, and 543. Laser projector 530 operates in generally the same manner as laser projectors 100 from FIG. 1 and the laser safety circuit operates in generally the same manner as laser safety circuit 200 from FIGS. 2A and 2B. Laser diodes 541, 542, and 543 output laser light to optical elements 551, 552, and 553, respectively. Optical element 551 reflects light from laser diode 541 towards optical element 552. At optical element 552, laser light from laser diode 541 is transmitted and combined with reflected light from laser diode 542, and the combined light is directed towards beam splitter/combiner 553. At beam splitter/combiner 553 aggregate light with components originating from laser diodes 541, 542, and 543 is combined and split in two directions. A first portion of the aggregate light is directed towards photodetector 561 and a second portion of the aggregate light is directed to an output of the laser projector. Output aggregate laser light may be directed towards a scan mirror to create an image in the field of view of the user. Photodetector 561 detects the first portion of aggregate light from the beam splitter and outputs a signal based on the power of the light. Latch 562 has a state/configuration that is responsive to the signal from the photodetector. The latch 562 remains in a first state/configuration if the signal from the photodetector 561 is below a threshold and changes to a second state/configuration if the signal from the photodetector 561 is at or above a threshold. The latch may be operable to store the current state during a reboot event and maintain (i.e., keep or reload) the state after the reboot event until and unless the latch is positively cleared, via a separate action by the user that is not part of an automated or autonomous process of rebooting. Switch 563 is communicatively coupled to and responsive to the state/configuration of latch 562. Switch 553 is selectively, electrically coupleable between power source 570 and laser diodes 541, 542, and 543 and can enable or disable electrical coupling between power source 570 and laser diodes 541, 542, and 543, in response to the state/configuration of latch 562. Processor 580 is communicatively coupled to and responsive to signals from photodetector 561. In response to a signal from photodetector 561 that is indicative of the power of the laser light being at or above a defined threshold, processor 580 stops modulating emission of light from laser diodes 541, 542, and 543. Processor 580 may be communicatively coupled to a non-transitory processor-readable storage medium or memory and, in response to a signal from photodetector 561 that is indicative of the power of the laser light being at or above a defined threshold, processor 580 may trigger and store a flag in the memory that survives any rebooting function or loss of power to the safety circuit or device and is accessed by processor 580 upon any such rebooting or restoration of power in order to ensure that processor 580 continues to prevent any further emission of laser light by laser diodes. 541, 542, and 543.

Throughout this specification and the appended claims, the term "carries" and variants such as carried by are generally used to refer to a physical coupling between two objects. The physical coupling may be direct physical coupling (i.e., with direct physical contact between the two objects) or indirect physical coupling mediated by one or more additional objects. Thus the term carries and variants such as "carried by" are meant to generally encompass all manner of direct and indirect physical coupling.

A person of skill in the art will appreciate that the various embodiments for laser projectors described herein may be applied in non-WHUD applications. For example, the present systems, devices, and methods may be applied in non-WHUD and/or in other applications that may or may not include a visible display.

In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The WHUDs described herein may receive and respond to commands from the user in one or more of a variety of ways, including without limitation: voice commands through a microphone; touch commands through buttons, switches, or a touch sensitive surface; and/or gesture-based commands through gesture detection systems as described in, for example, U.S. Non-Provisional patent application Ser. No. 14/155,087, U.S. Non-Provisional patent application Ser. No. 14/155,107, PCT Patent Application PCT/US2014/057029, and/or U.S. Provisional Patent Application Ser. No. 62/236,060, all of which are incorporated by reference herein in their entirety.

Throughout this specification and the appended claims, infinitive verb forms are often used. Examples include, without limitation: "to detect," "to provide," "to transmit," "to communicate," "to process," "to route," and the like. Unless the specific context requires otherwise, such infinitive verb forms are used in an open, inclusive sense, that is as "to, at least, detect," to, at least, provide," "to, at least, transmit," and so on.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet which are owned by Thalmic Labs Inc., including but not limited to: U.S. Non-Provisional patent application Ser. No. 14/155,087, U.S. Non-Provisional patent application Ser. No. 14/155,107, PCT Patent Application PCT/US2014/057029, U.S. Provisional Patent Application Ser. No. 62/236,060; and U.S. Provisional Patent Application Ser. No. 62/367,501, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A laser projector comprising:
   at least one laser diode;
   a power source;
   a photodetector responsive to laser light output by the at least one laser diode;
   a beam splitter positioned and oriented to direct a first portion of laser light from the at least one laser diode along a first optical path towards the photodetector and a second portion of laser light from the at least one laser diode along a second optical path towards an output of the laser projector; and
   a laser safety circuit communicatively coupled to the photodetector and responsive to signals therefrom, the laser safety circuit comprising a switch that mediates an electrical coupling between the power source and the at least one laser diode, wherein in response to a signal from the photodetector indicative that a power of the laser light output by the at least one laser diode exceeds a threshold, the switch interrupts a supply of power to the at least one laser diode from the power source.

2. The laser projector of claim 1 wherein the laser safety circuit further includes a latch that is communicatively coupled to the photodetector and to the switch, and wherein:
   a state of the latch is responsive to signals from the photodetector and the switch is responsive to the state of the latch;
   the state of the latch changes from a first state to a second state in response to the signal from the photodetector indicative that the power of the laser light output by the at least one laser diode exceeds the threshold; and
   the switch interrupts the supply of power to the at least one laser diode from the power source in response to the state of the latch changing from the first state to the second state.

3. The laser projector of claim 2 wherein the latch is operable to store a current state selected from the first state and the second state and maintain the current state during a reboot event.

4. The laser projector of claim 1, further comprising:
   a processor communicatively coupled to the at least one laser diode and to the photodetector, the processor to modulate the at least one laser diode, wherein, in response to the signal from the photodetector indicative that the power of the laser light output by the at least one laser diode exceeds the threshold, the processor stops modulating the at least one laser diode and prevents further modulations of the at least one laser diode.

5. The laser projector of claim 4, further comprising a non-transitory processor-readable storage medium communicatively coupled to the processor, wherein:
in response to the signal from the photodetector indicative that the power of the laser light output by the at least one laser diode exceeds the threshold, the processor stores a flag in the non-transitory processor-readable storage medium; and
upon boot-up of the laser projector, the processor accesses the non-transitory processor-readable storage medium to check for the flag, wherein in response to the processor finding the flag stored in the non-transitory processor-readable storage medium the processor prevents modulations of the at least one laser diode.

6. The laser projector of claim 1 wherein:
the at least one laser diode includes a red laser diode, a green laser diode, and a blue laser diode; and
the photodetector is responsive to laser light from each of the red laser diode, the green laser diode, and the blue laser diode, wherein the signal from the photodetector is indicative of a total combined power of red laser light from the red laser diode, green laser light from the green laser diode, and blue laser light from the blue laser diode.

7. The laser projector of claim 6 wherein:
the at least one laser diode further includes an infrared laser diode; and
the photodetector is responsive to infrared laser light from the infrared laser diode, wherein the signal from the photodetector is indicative of a total combined power of red laser light from the red laser diode, green laser light from the green laser diode, blue laser light from the blue laser diode, and infrared laser light from the infrared laser diode.

8. The laser projector of claim 7, further comprising:
a beam combiner oriented to receive red laser light from the red laser diode, green laser light from the green laser diode, blue laser light from the blue laser diode, and infrared laser light from the infrared laser diode and to combine the red laser light, the green laser light, the blue laser light, and the infrared laser light into an aggregate laser beam, at least a portion of the beam combiner positioned upstream from the beam splitter with respect to an optical path of the laser light.

9. The laser projector of claim 1, further comprising:
a support structure that in use is worn on a head of the user, wherein the laser projector is carried by the support structure; and
a transparent combiner carried by the support structure and positioned within a field of view of the user, the transparent combiner to direct the second portion of laser light from the output of the laser projector to the field of view of the user.

10. The laser projector of claim 1 wherein the threshold is an independent, non-varying threshold.

* * * * *